(12) United States Patent
Otani

(10) Patent No.: US 9,078,359 B2
(45) Date of Patent: Jul. 7, 2015

(54) CHIP-TYPE CERAMIC ELECTRONIC COMPONENT AND PRODUCING METHOD THEREOF

(71) Applicant: MURATA MANUFACTURING CO., LTD., Nagaokakyo-Shi, Kyoto-fu (JP)

(72) Inventor: Shinji Otani, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 172 days.

(21) Appl. No.: 13/864,617

(22) Filed: Apr. 17, 2013

(65) Prior Publication Data

US 2013/0220696 A1    Aug. 29, 2013

Related U.S. Application Data

(63) Continuation of application No. PCT/JP2011/071663, filed on Sep. 22, 2011.

(30) Foreign Application Priority Data

Oct. 18, 2010 (JP) ................... 2010-233272

(51) Int. Cl.
| | |
|---|---|
| H01G 4/30 | (2006.01) |
| H01G 4/228 | (2006.01) |
| H05K 1/02 | (2006.01) |
| H01G 4/12 | (2006.01) |
| H01G 4/232 | (2006.01) |
| H05K 1/03 | (2006.01) |

(52) U.S. Cl.
CPC .............. *H05K 1/0271* (2013.01); *H01G 4/12* (2013.01); *H01G 4/2325* (2013.01); *H01G 4/30* (2013.01); *H05K 1/0306* (2013.01)

(58) Field of Classification Search
USPC .................. 361/301.4, 306.1, 306.3
See application file for complete search history.

(56) References Cited

U.S. PATENT DOCUMENTS

2006/0187613 A1    8/2006    Yoshii et al.

FOREIGN PATENT DOCUMENTS

| CN | 1822263 A | | 8/2006 |
|---|---|---|---|
| JP | 05144665 A | * | 6/1993 |
| JP | 05144666 A | * | 6/1993 |
| JP | 06-005462 A | | 1/1994 |
| JP | 09190950 A | * | 7/1997 |

(Continued)

OTHER PUBLICATIONS

PCT/JP2011/071663 Written Opinion dated Oct. 17, 2011.

(Continued)

*Primary Examiner* — Eric Thomas
(74) *Attorney, Agent, or Firm* — Arent Fox LLP

(57) ABSTRACT

The electronic component has a resin electrode which constitutes an external electrode on a face of a ceramic base body. At least a tip portion of a resin electrode region extended around another face of the body is bonded to the ceramic base body, and further a relationship between Rz1 and Rz2 satisfies the following requirement:

$Rz1 > Rz2$, $Rz1 > 3.3 \mu m$, and $Rz2 < 3.2 \mu m$, wherein Rz1 is a ten-point average surface roughness of a first region of a surface of the ceramic base body to which the tip portion is bonded, and Rz2 is a ten-point average surface roughness of a second region of the surface of the ceramic base body where the external electrode is not formed.

18 Claims, 5 Drawing Sheets

(56) References Cited

FOREIGN PATENT DOCUMENTS

| | | |
|---|---|---|
| JP | 11-219849 A | 8/1999 |
| JP | 2005-197530 A | 7/2005 |
| JP | 2008-071926 A | 3/2008 |

OTHER PUBLICATIONS

Chinese Office Action dated Mar. 26, 2015 issued in Chinese Patent Application No. 201180050122.6.

* cited by examiner

CHIP-TYPE CERAMIC ELECTRONIC COMPONENT AND PRODUCING METHOD THEREOF

CROSS REFERENCE TO RELATED APPLICATIONS

The present application is a continuation of International application No. PCT/JP2011/071663, filed Sep. 22, 2011, which claims priority to Japanese Patent Application No. 2010-233272, filed Oct. 18, 2010, the entire contents of each of which are incorporated herein by reference.

FIELD OF THE INVENTION

The present invention relates to a chip-type ceramic electronic component, and a producing method thereof, and specifically to a chip-type ceramic electronic component characterized by an arrangement-form of its external electrode, and a producing method thereof.

BACKGROUND OF THE INVENTION

A ceramic electronic component related to the present invention is, for example, a component described in JP 11-219849 A (Patent Document 1).

This ceramic electronic component has a ceramic base body in a rectangular parallelepiped form, a plurality of internal electrodes arranged inside the ceramic base body to be opposed to each other across a ceramic layer, and a pair of external electrodes each formed on an end face of the ceramic base body to be electrically connected to predetermined one of the internal electrodes.

The external electrodes each have an underlying electrode formed by firing a conductive paste containing a metal powder, a glass powder, an organic binder and an organic solvent, and an overlying electrode formed on this underlying electrode and obtained by setting a conductive paste containing a metal powder, a thermosetting resin and an organic solvent thermally. The external electrodes are formed to be extended from the respective end faces of the body of the component around respective partial regions of the side faces thereof.

It is stated that about each of the external electrodes in this ceramic electronic component, its overlying electrode covers the whole of its underlying electrode and further the overlying electrode is extended over the circumference of the underlying electrode up to the side faces of the ceramic base body. According to Patent Document 1, it is preferred that the overlying electrode is extended from the circumference of the underlying electrode by a length of 0.05 mm or more. This is for a purpose that when an excessive stress is applied from the outside to the external electrode, this stress is absorbed in the overlying electrode to prevent a crack or other damages to be generated in the outer circumference of end regions of the body of the component. It is stated that if the length of the overlying-electrode-portion over the circumference is less than 0.05 mm, the damages such as the crack become remarkable.

JP 2008-71926 A (Patent Document 2) discloses a ceramic electronic component including a ceramic base body (component body) in a rectangular parallelepiped form, which is made of a ceramic material; an internal electrode formed inside the ceramic base body; and an external electrode formed to be extended from an end face of the ceramic base body around a side face thereof, and to be electrically connected to the internal electrode; in which the external electrode has an underlying electrode formed by firing a conductive paste containing a metal powder, a glass powder, an organic binder and an organic solvent, and an overlying electrode that is a resin electrode positioned over the underlying electrode, the overlying electrode that is a resin electrode is formed in the rear of the tip portion of the underlying electrode, and the overlying electrode is formed not to cover the whole of the underlying electrode.

Patent Document 1: JP 11-219849 A
Patent Document 2: JP 2008-71926 A

SUMMARY OF THE INVENTION

However, when an overlying electrode made by setting a conductive paste containing a thermosetting resin thermally is formed to be extended over the circumference of an underlying electrode onto a side face of the ceramic base body as in the ceramic electronic component in Patent Document 1, there is caused a problem that when the body is immersed in high-temperature solder, a circumferential portion of the overlying electrode may be peeled from the side face of the ceramic base body so that this electronic component is low in reliability.

The ceramic electronic component in Patent Document 2 has a structure in which its overlying electrode does not cover its underlying electrode completely; thus, this component has a problem that stress is concentrated onto the underlying electrode, which is high in elasticity, so that the component is declined in substrate bending resistance.

The present invention is an invention for solving the problems, and an object thereof is to provide a highly reliable chip-type ceramic electronic component which has an external electrode having a tip portion that can be restrained from being peeled from a ceramic base body, at least the tip portion being a resin electrode, and which is excellent in property of being picked up by absorption and in substrate bending resistance; and a chip-type-ceramic-electronic-component producing method capable of producing such a chip-type ceramic electronic component effectively.

In order to solve the above-mentioned problems, the chip-type ceramic electronic component of the invention comprises:

a rectangular-parallelepiped-form ceramic base body having two end faces opposed to each other, and four side faces through which the two end faces are connected to each other, and an external electrode arranged to be extended from a face selected from the end faces and the side faces over an edge line of the ceramic base body around one of the faces different from the selected face, and at least a tip portion of the region extended around the different face is constituted by a resin electrode comprising a resin and a conductive component, wherein at least the tip portion of the region extended around the different face that is a region of the resin electrode constituting the external electrode is bonded to the ceramic base body, and further a relationship between Rz1 and Rz2 satisfies the following requirement:

$Rz1 > Rz2$, $Rz1 > 3.3\ \mu m$, and $Rz2 < 3.2\ \mu m$, wherein Rz1 is the ten-point average surface roughness of a region of a surface of the ceramic base body that is a region to which the tip portion of the external electrode is bonded, and Rz2 is the ten-point average surface roughness of a region of the surface of the ceramic base body that is a region where the external electrode is not formed.

The chip-type ceramic electronic component of the invention is a component
wherein the ceramic base body has an internal electrode, and the internal electrode is led out to predetermined one of the faces of the ceramic base body, and
the external electrode is formed to be extended from the face of the ceramic base body to which the internal electrode is led out, over the edge line, onto the different face.

In the chip-type ceramic electronic component, it is preferred that the external electrode comprises: an underlying electrode bonded to the surface of the ceramic base body; and an overlying electrode arranged to cover the underlying electrode and being an electrode in which at least the tip portion of the region extended around the different face is bonded to the surface of the ceramic base body, and the overlying electrode is the resin electrode.

It is preferred that the overlying electrode covers the whole of the underlying electrode and further the circumference of the overlying electrode wholly reaches a region of the body outside the circumference of the underlying electrode to be bonded directly to the surface of the ceramic base body.

It is preferred that the ceramic base body has the internal electrode and one or more internal electrode equivalent to the internal electrode; predetermined one of the internal electrodes is exposed to any one of the two end faces of the ceramic base body, which are opposed to each other; the underlying electrode is formed over the end face; the overlying electrode, which is constituted by the resin electrode, covers the underlying electrode, and is further extended over the edge line around the side face of the ceramic base body, so that at least the tip portion of the region extended around the side face is bonded directly to the ceramic base body.

It is preferred that the underlying electrode is one of a baked electrode formed by firing a conductive paste comprising a metal powder, a glass powder, an organic binder and an organic solvent, and a plating electrode formed by plating.

It is preferred that any one of the following is formed as a plating film layer for improving the external electrode in solderability:
(a) a plating film layer comprising a first plating film layer made of a Ni plating film, and a second plating film layer made of a Sn plating film formed over the first plating film layer; and
(b) a plating film layer comprising a first plating film layer made of a Ni plating film, and a second plating film layer made of a Pb plating film formed over the first plating film layer.

The chip-type-ceramic-electronic-component producing method of the invention is a method for producing the chip-type ceramic electronic component recited in any one of claims 1 to 7, comprising the following steps as the step of forming the ceramic base body wherein the relationship between Rz1 and Rz2 satisfies the following requirement:

Rz1>Rz2,

Rz1>3.3 μm, and

Rz2<3.2 μm wherein Rz1 is the ten-point average surface roughness of the region to which the tip portion of the external electrode is bonded, and Rz2 is the ten-point average surface roughness of the region of the surface of the ceramic base body where the external electrode is not formed:

the step of stirring the ceramic base body together with a slurry comprising an adhesive medium to polish the whole of the surface of the ceramic base body; and the step of masking the region of the surface of the ceramic base body polished in the above-mentioned step where the external electrode is not formed, and spraying an adhesive to the resultant exposed region to surface-roughen a face of the ceramic base body where the external electrode is to be formed.

The chip-type ceramic electronic component of the invention is a chip-type ceramic electronic component comprising a ceramic base body, and an external electrode arranged to be extended from a face selected from end faces and side faces of the ceramic base body over an edge line of the ceramic base body around one of the faces different from the selected face, and at least a tip portion of the region extended around the different face is constituted by a resin electrode comprising a resin and a conductive component, wherein the tip portion of the external electrode that is constituted by the resin electrode is bonded to the ceramic base body, and further a relationship between Rz1 and Rz2 satisfies the following requirement: Rz1>Rz2, Rz1>3.3 μm, and Rz2<3.2 μm, wherein Rz1 is the ten-point average surface roughness of a region of a surface of the ceramic base body that is a region to which the tip portion is bonded, and Rz2 is the ten-point average surface roughness of a region of the surface of the ceramic base body that is a region where the external electrode is not formed; thus, in at least the tip portion of the region extended around the different face of the ceramic base body, this region being a region of the resin electrode constituting the external electrode, the generation of a peel thereof can be restrained. Thus, the electronic component of the invention can be provided as a highly reliable chip-type ceramic electronic component.

In other words, in the case of causing the relationship between the ten-point average surface roughness Rz1 of the region to which the tip portion of the external electrode is bonded, and the ten-point average surface roughness Rz2 of the region where the external electrode is not formed to satisfy the requirement of Rz1>Rz2, Rz1>3.3 μm, and Rz2<3.2 μm, at least the tip portion of the resin electrode constituting the external electrode is formed in the region the surface of which is made rougher than the surface of the region where the external electrode is not formed. Accordingly, in the tip portion, the material of the resin electrode constituting the external electrode penetrates into irregularities of the roughened surface of the ceramic base body to be engaged with the irregularities. By the resultant anchor effect, at least the tip portion of the resin electrode constituting the external electrode comes to be strongly bonded to the ceramic base body. Thus, the electronic component of the invention can be provided as a highly reliable chip-type ceramic electronic component making it possible that even when this component is exposed to high temperature in, for example, a soldering step, a tip portion of a resin electrode which constitutes its external electrode is prevented from being peeled. Additionally, this component is a component which is excellent in substrate bending resistance, has a ceramic base body having a smooth surface region where no external electrode is formed, and is good in property of being picked up by absorption.

In a case where at least a tip portion of an external electrode is a resin electrode made of an electrode material containing a resin and a conductive component, the electrode is easily peeled from the tip portion when its bonded surface is not roughened. According to the invention, however, at least the tip portion of the resin electrode constituting the external electrode comes to be bonded to the region the surface of which is made rougher than the surface of the region where the external electrode is not formed. Thus, the tip portion of the resin electrode constituting the external electrode can be certainly restrained and prevented from being peeled from the ceramic base body.

When the invention is applied to a chip-type ceramic electronic component in which a ceramic base body has an internal electrode, and the internal electrode is led out to a predetermined face of the ceramic base body, an external electrode is formed to be extended from the face of the ceramic base body to which the internal electrode is led out, over an edge line of the body, onto a face thereof different from the face, a resin electrode constituting the external electrode can be certainly restrained and prevented from being peeled from the ceramic base body. Thus, the electronic component of the invention can be provided as a highly reliable chip-type ceramic electronic component.

According to the invention, in the case of making the external electrode into a structure having an underlying electrode bonded to the surface of the ceramic base body, and an overlying electrode arranged to cover the underlying electrode and being an electrode in which at least the tip portion of the region extended around the different face is bonded to the surface of the ceramic base body, and additionally rendering the overlying electrode the resin electrode, a circumferential region of the resin electrode (overlying electrode) constituting the external electrode can be certainly restrained and prevented from being peeled from the ceramic base body. Thus, the electronic component of the invention can be provided as a highly reliable chip-type ceramic electronic component.

By making the ceramic electronic component into a structure in which the overlying electrode covers the whole of the underlying electrode and further the circumference of the overlying electrode wholly reaches a region of the body outside the circumference of the underlying electrode to be bonded directly to the surface of the ceramic base body, the resin electrode constituting the external electrode can be certainly restrained and prevented from being peeled from the ceramic base body. Thus, the electronic component of the invention can be provided as a highly reliable chip-type ceramic electronic component.

When the invention is applied to a chip-type ceramic electronic component in which a ceramic base body has an internal electrode, and the internal electrode is led out to a predetermined face of the ceramic base body, an external electrode is formed to be extended from the face of the ceramic base body to which the internal electrode is led out, over an edge line of the body, onto a face thereof different from the face, a resin electrode constituting the external electrode can be certainly restrained and prevented from being peeled from the ceramic base body. Thus, the electronic component of the invention can be provided as a highly reliable chip-type ceramic electronic component.

The ceramic electronic component may be made into a structure in which the ceramic base body has the internal electrode and one or more internal electrode equivalent to the internal electrode; predetermined one of the internal electrodes is exposed to any one of the two end faces of the ceramic base body, which are opposed to each other; the underlying electrode is formed over the end face; the overlying electrode, which is constituted by the resin electrode, covers the underlying electrode, and is further extended over the edge line around the side face of the ceramic base body, so that at least the tip portion of the region extended around the side face is bonded directly to the ceramic base body. In this case, in the chip-type ceramic electronic component which may be, for example, an ordinary stacked ceramic condenser having a ceramic base body having at both end regions thereof external electrodes, respectively, the external electrodes are restrained and prevented from being peeled. Thus, the electronic component of the invention can be provided as a highly reliable chip-type ceramic electronic component.

By using, as the underlying electrode, a baked electrode formed by firing a conductive paste comprising a metal powder, a glass powder, an organic binder and an organic solvent, or a plating electrode formed by plating, the external electrode is high in electrical conduction reliability, and the external electrode is not peeled in, for example, a soldering step. Thus, the electronic component of the invention can be provided as a highly reliable chip-type ceramic electronic component.

By forming, over the front surface of the external electrode, (a) a plating film layer comprising a first plating film layer made of a Ni plating film, and a second plating film layer made of a Sn plating film formed over the first plating film layer, or (b) a plating film layer comprising a first plating film layer made of a Ni plating film, and a second plating film layer made of a Pb plating film formed over the first plating film layer, the solderability of the external electrode can be improved. Thus, the invention can be made actually effective.

In the chip-type-ceramic-electronic-component producing method of the invention, the ceramic base body is stirred together with the slurry containing the polishing medium to polish the whole of the surface of the ceramic base body. Subsequently, while the region of the surface of the ceramic base body where the external electrode is not formed is masked, the adhesive is sprayed to the resultant exposed region, so as to surface-roughen the face of the ceramic base body where the external electrode is to be formed. The ceramic base body can be formed, with a certainty and a good efficiency, as a ceramic base body in which a relationship between Rz1 and Rz2 satisfies the following requirement: Rz1>Rz2, Rz1>3.3 µm, and Rz2<3.2 µm wherein Rz1 is the ten-point average surface roughness of a region to which a tip portion of an external electrode is bonded, and Rz2 is the ten-point average surface roughness of the region of the surface of the ceramic base body where the external electrode is not formed.

It therefore becomes possible to provide a highly reliable chip-type ceramic electronic component capable of preventing its external electrode from being peeled and also excellent in substrate bending resistance.

In the invention, the method for stirring the ceramic base body together with the slurry containing the polishing medium to polish the whole of the surface of the ceramic base body is, for example, a barrel-polishing method.

DETAILED DESCRIPTION OF THE INVENTION

Hereinafter, embodiments of the invention will be demonstrated to describe characteristics of the invention in more detail.

Example 1

[1] Formation of Chip-Type Ceramic Electronic Components

Figure 1:
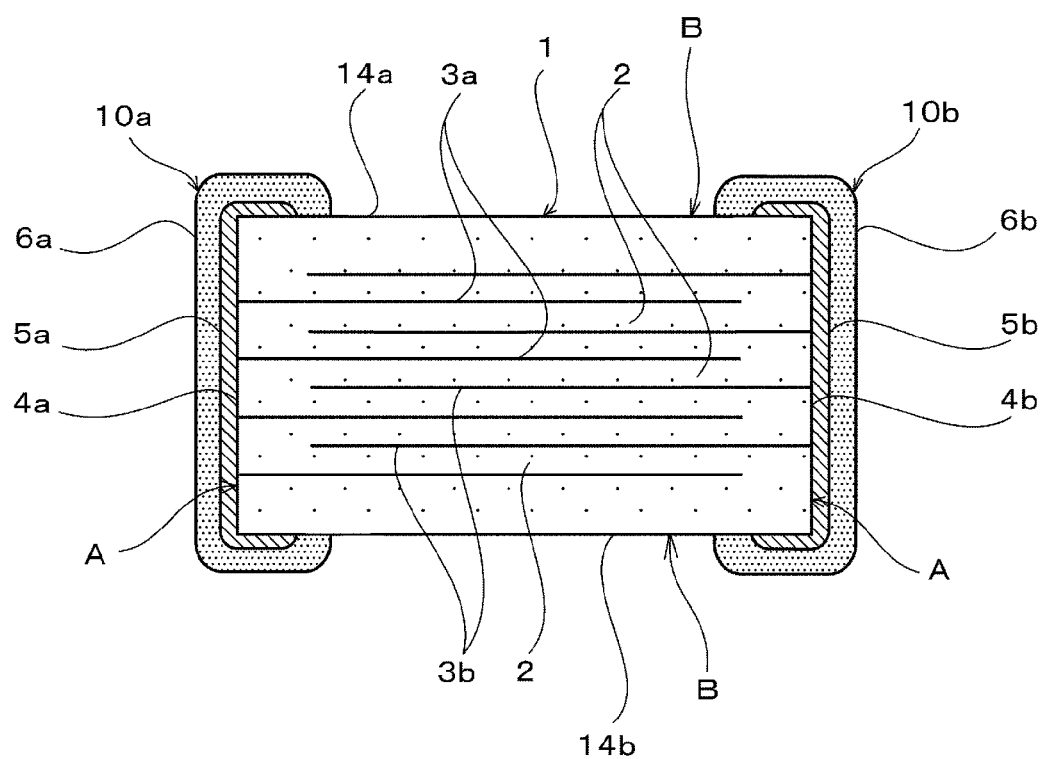
FIG. 1 is a front sectional view of any one of chip-type ceramic electronic components according to an example (Example 1) of the invention.
Figure 2:
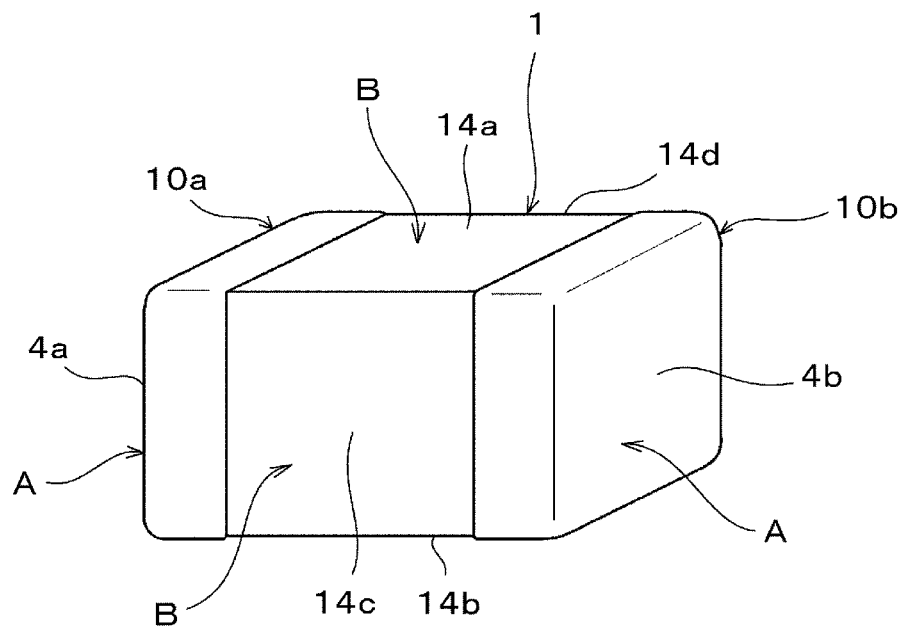
FIG. 2 is a perspective view of the chip-type ceramic electronic component according to the example (Example 1) of the invention.

In this example, each stacked ceramic condenser having a structure as illustrated in FIGS. 1 and 2 was formed as a chip-type ceramic electronic component. As illustrated in FIGS. 1 and 2, the stacked ceramic condenser has a rectangular parallelepiped shape having end faces $4a$ and $4b$, and side faces $14a$, $14b$, $14c$ and $14d$. The condenser further has a ceramic stacked body (ceramic base body) 1 having ceramic layers 2, internal electrodes $3a$ and $3b$, and external electrodes $10a$ and $10b$ arranged to be electrically connected to the internal electrodes $3a$ and $3b$, respectively.

The external electrodes $10a$ and $10b$ are arranged to be extended from the end faces $4a$ and $4b$ of the ceramic base body 1, respectively, which are at two non-side-face-sides of the body 1, over its edge lines, respectively, and to be each extended around the faces other than the end faces $4a$ and $4b$, that is, to be each extended in this example around the four side faces $14a$, $14b$, $14c$ and $14d$.

The external electrodes $10a$ and $10b$ have underlying electrodes (baked electrodes) $5a$ and $5b$, respectively, which are formed by painting and baking a conductive paste; and overlying electrodes $6a$, $6b$ which are resin electrodes arranged to cover the underlying electrodes $5a$ and $5b$, respectively.

Furthermore, in the stacked ceramic condenser of this example, a Ni plating film is formed as a first plating film layer on each of the overlying electrodes (resin electrodes) $6a$ and $6b$, which constitute the external electrodes $10a$ and $10b$, respectively, and further a Sn plating film is formed as a second plating film layer on the Ni plating film although this situation is not illustrated in FIG. 1 nor 2.

In this example, the Sn plating film is formed as the second plating film layer; however, instead of the Sn plating layer, a Pb plating film may be formed as the second plating film layer.

The following will describe a method for producing the stacked ceramic condenser.

Formation of Each Ceramic Base Body

First, each condenser element (ceramic base body) 1 (see FIGS. 1 and 2) was formed which had therein plural internal electrodes, and had a length of 3.2 mm, a width of 1.6 mm and a thickness of 1.6 mm. The ceramic base body may be formed by various known methods, such as a method of stacking ceramic green sheets onto each of which an internal-electrode-forming conductive paste was formed, bonding the sheets to each other under pressure, cutting the stacked body, and then firing the cut bodies.

(2) Polishing the Entire Surfaces of Each of the Ceramic Base Bodies.

Next, 1000 of the ceramic base bodies were put into a pot (barrel) having a diameter of 200 mm and an axial-direction-length of 250 mm. Simultaneously, into the pot were put 500 g of alumina powder A-43L (manufactured by Showa Denko K.K., D50=1.5 µm) and 2000 g of pure water. The ceramic base bodies were polished (barrel-polished) by rotating the pot at a rotation number of 60 rmp provided that the period for treating the bodies was varied. In this way, the entire surfaces of each of the ceramic base bodies were polished. Thereafter, the ceramic base bodies were washed with pure water, and then the ceramic base bodies, the entire surfaces of which were polished, were separated from each other, and dried.

(3) Local Surface-Roughening of the Ceramic Base Bodies by Spraying an Abrasive

Figure 3:
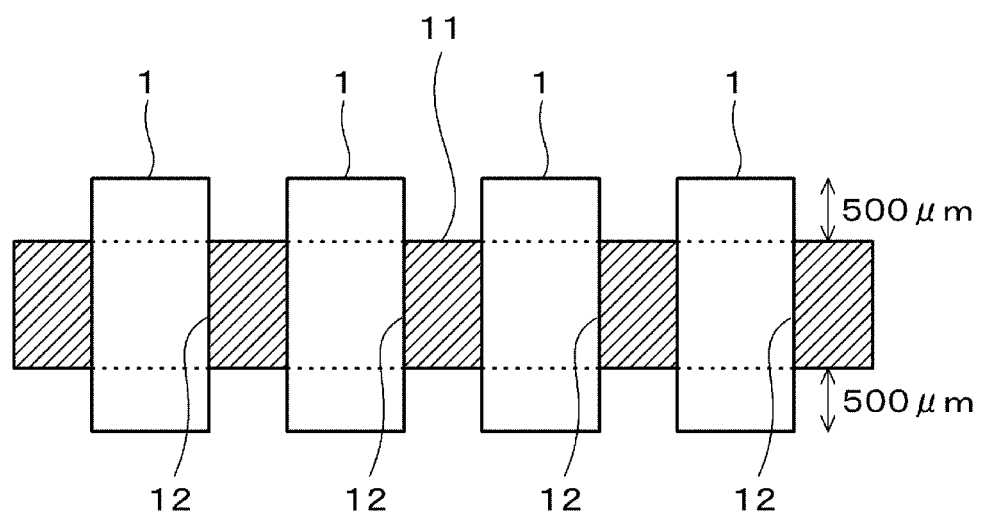
FIG. 3 is a view referred to for describing a method for producing the chip-type ceramic electronic components according to the example (Example 1) of the invention, and is a view illustrating a state that ceramic base bodies are held in a holding plate when the ceramic base bodies are locally surface-roughened.

As illustrated in FIG. 3, some of the ceramic base bodies 1, the entire surfaces of which were polished, were inserted to respective holding holes 12 in a holding plate 11 for holding the ceramic base bodies 1 to project both end portions of each of the ceramic base bodies 1 by about 500 µm, so that the ceramic base bodies 1 were held.

Figure 4:
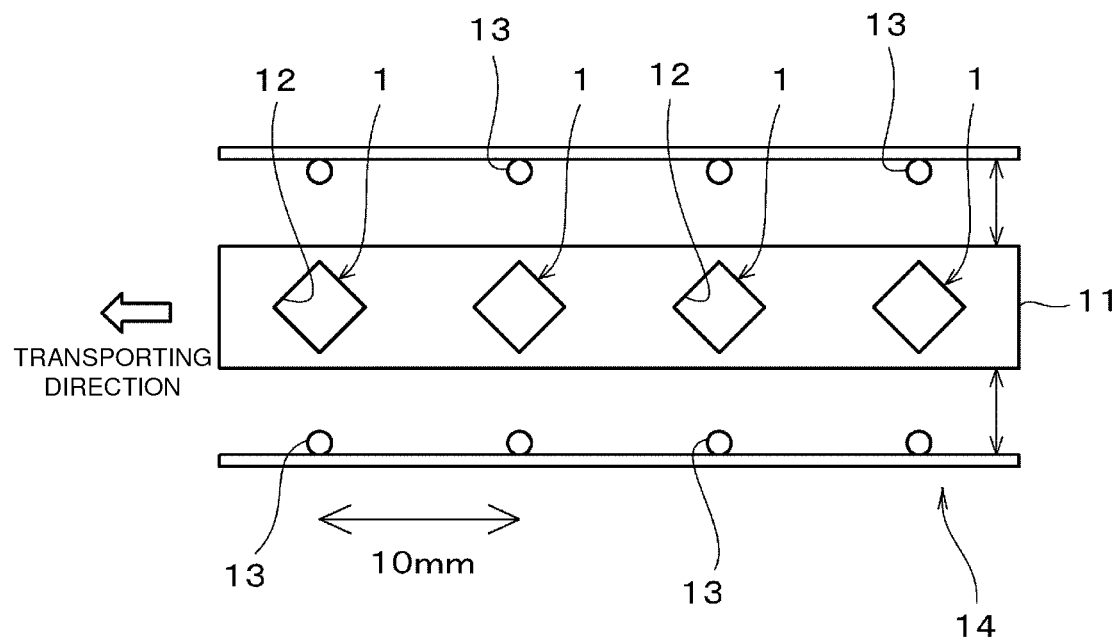
FIG. 4 is a view referred to for describing the method for producing the chip-type ceramic electronic components according to the example (Example 1) of the invention, and is a view illustrating a manner of spraying an adhesive onto the ceramic base bodies to perform the local surface-roughening.

As illustrated in FIG. 4, which is a schematic plan view, the holding plate 11, in which the ceramic base bodies 1 were held, was then transported into a predetermined direction while a spray machine 14 having, along the transporting direction, four nozzles 13 at each side of the holding plate 11, i.e., eight nozzles 13 as a whole was used to spray broken alumina powder A-12C (manufactured by Showa Denko K.K., D50=84 µm) onto the ceramic base bodies 1 held in the holding plate 11. The respective nozzles of the spray machine 14 for spraying the broken alumina powder were adjusted to 2 mmφ in size (nozzle diameter); and the spray amount per nozzle, to 10.0 g/s. A change was made about the transporting period of the ceramic base bodies 1 (the period when the ceramic base bodies stayed in a zone to which the broken alumina powder was sprayed), thus varying the period for surface-roughening. In this way, the ceramic base bodies 1 were surface-roughened.

In this example, adjustments were made about the period for the entire-surface polishing based on the barrel polishing and the period for the surface-roughening by the alumina powder spraying, so as to obtain the following samples: samples in each of which a relationship between Rz1 and Rz2 satisfied a requirement of Rz1>Rz2, Rz1>3.3 µm, and Rz2<3.2 µm; and other samples in each of which a relationship between Rz1 and Rz2 did not satisfy this requirement, wherein Rz1 was the ten-point average roughness of respective regions of the surface of one of the ceramic base bodies 1 where the external electrodes $10a$ and $10b$ were formed, these regions including respective regions A to which tip portions of the resin electrodes $6a$ and $6b$ constituting the external electrodes $10a$ and $10b$, respectively, were bonded, and Rz2 was the ten-point average roughness of regions B of the surface of the ceramic base body 1 where the external electrodes $10a$ and $10b$ were not formed.

In Table 1 is shown a combinational relationship between the period for the entire-surface polishing based on the barrel polishing and the period for the surface-roughening by the alumina powder spraying.

TABLE 1

| Polishing period of entire unit, using alumina slurry (min) | Local-surface-roughening period (transporting period) of unit, using alumina powder spraying (min) |
| --- | --- |
| 45 | 0 (Comparative Example 1), 10, 20, 30, 40, 50 |
| 30 | 0, 10, 20, 30, 40 |
| 15 | 0, 10, 20, 30, 40 |
| 5 | 0, 10, 20 |

4) Formation of Underlying Electrodes (Underlying Conductor Layers)

A conductive paste having a composition shown in Table 2 was squeegeed into a thickness of 300 µm onto a table. One of the end faces of each of the surface-roughened ceramic base bodies obtained as described above was immersed into this conductive paste to paint the conductive paste onto the one end face of the ceramic base body. This workpiece was dried at 120° C. for 15 minutes.

Thereafter, the conductive paste was painted onto the other end face of the ceramic base body, and then dried by the same method under the same conditions.

Subsequently, the ceramic base body 1 having the two end faces on which the conductive paste was painted was subjected to thermal treatment giving a peak top temperature of 750° C. to form underlying electrodes.

TABLE 2

| Components | Content by percentage (% by weight) |
| --- | --- |
| Methacrylic resin | 5 |
| Acrylic resin | 5 |
| Ethylene glycol monobutyl ether | 5 |
| Terpineol | 15 |
| Glass powder | 5 |
| Copper powder A (spherical form) | 20 |
| Copper powder B (flat form) | 45 |

5) Formation of Overlying Electrodes (Conductive Resin Layers)

First, an overlying-electrode-forming resin electrode paste (conductive resin composition) was formed through the following steps:

A small-size mixer was used to mix a conductive thermosetting resin composition (see Table 3) composed of a bisphenol A type epoxy resin (epoxy equivalent: 1470 g/eq) and a novolak phenol resin (hydroxyl equivalent: 105 g/eq) mixed with each other in equivalent amounts, and then a three-axis roll was used to knead the composition further.

TABLE 3

| Components | Content by percentage (% by weight) |
| --- | --- |
| Bisphenol A type epoxy resin | 14 |
| Novolak type phenol resin | 1 |
| Imidazole | 1 |
| Silver powder A (spherical form) | 24 |
| Silver powder B (flat form) | 40 |
| Diethylene glycol monobutyl ether | 20 |

A high-boiling-point solvent was then used to adjust the composition into a viscosity of 25±2 Pa·s (E-type viscometer; rotational number: 1 rpm).

The resin electrode paste (conductive resin composition) having the thus-adjusted viscosity was squeegeed into a thickness of 500 µm onto a table. One of the end faces of each of the ceramic base bodies 1 having the underlying electrode formed as described above was immersed into this resin electrode paste to paint the resin electrode paste onto the one end face. At this time, the immersing speed of the ceramic base body 1 into the resin electrode layer was set to 0.2 mm/s; the pulling-up speed thereof, to 3.0 mm; and the period when the body was held at the bottom dead center, to 1.5 s.

This workpiece was then dried at 150° C. for 15 minutes to dry the painted resin electrode paste.

Subsequently, the resin electrode paste was painted onto the other end face of the ceramic base body, and then dried by the same method under the same conditions.

Thereafter, the ceramic base body 1 having the two end faces on which the resin electrode paste was painted and dried was kept in the atmosphere at a peak top temperature of 200° C. for 2 hours to set the resin electrode paste thermally, thus forming overlying electrodes.

(6) Formation of Plating Films

A plating film was formed on the surface of each of the overlying electrodes formed as described above by a wet barrel electroplating method.

In this example, a Ni plating film was formed, as a first plating film layer, into a thickness of about 3.5±1.5 µm onto the surface of each of the overlying electrodes, and further a Sn plating film was formed, as a second plating film layer, into a thickness of about 3.5±1.5 µm thereonto.

In this way, each stacked ceramic condenser having a structure as illustrated in FIGS. 1 and 2 (each of samples No. 1 to samples No. 18 in Table 4) was yielded.

(7) Formation of Samples (Stacked Ceramic Condensers) as Comparative Examples (a) Each Sample of Comparative Example 1

For comparison, each sample (stacked ceramic condenser) of Comparative Example 1 (each sample of sample No. 19 in Table 4) was formed by the same method under the same conditions as in Example 1 except that the entire surfaces of one of the ceramic base bodies were merely polished for 45 minutes without conducting any local surface-roughening of the unit by abrasive-spraying. The sample of Comparative Example 1 was a sample in which the surface roughness of regions of the ceramic base body where no external electrodes were formed was equal to that of respective regions where external electrodes were formed, that is, a sample in which the surface roughness of the ceramic base body was even throughout the whole thereof.

(b) Each Sample of Comparative Example 2

Figure 5:
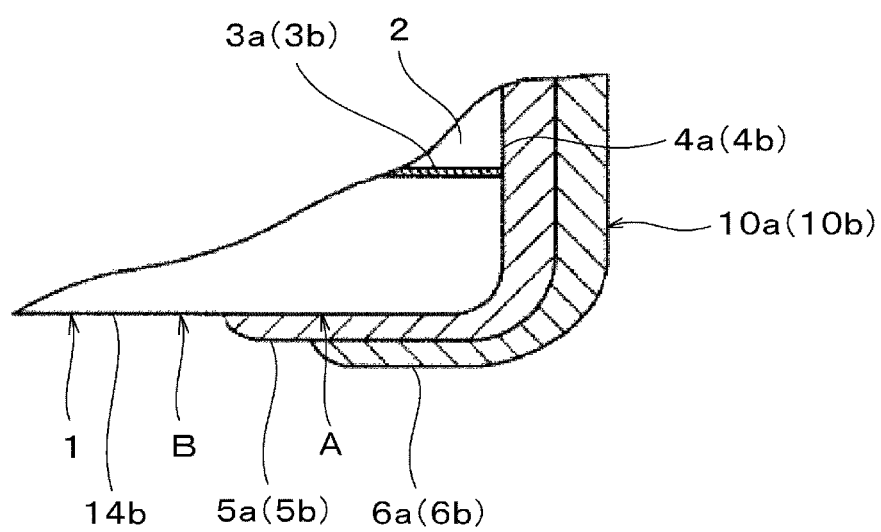
FIG. 5 is a view illustrating any one of samples (stacked ceramic condensers) of Comparative Example 2.

FIG. 5 is a view illustrating any one of samples (stacked ceramic condensers) of Comparative Example 2. In the same manner as in Comparative Example 1, each sample of Comparative Example 2 was a stacked ceramic condenser in which the surface roughness of regions of one of the ceramic base bodies where no external electrodes were formed was equal to that of respective regions where external electrodes were formed, and further underlying electrodes and overlying electrode were formed. As illustrated in FIG. 5, however, the sample was a stacked ceramic condenser having a structure in which the overlying electrode 6a (6b), which was a resin electrode, did not reach an edge portion (tip portion) of the underlying electrode 5a (5b) and a tip portion of the overlying electrode 6a (6b) was not bonded to the ceramic base body 1.

The stacked ceramic condenser of Comparative Example 2 was a condenser having the same structure as a ceramic electronic component in Patent Document 2 (JP 2008-71926 A). In FIG. 5, any part to which the same reference number or symbol as in FIG. 1 is attached represents the same part or a corresponding part.

When the stacked ceramic condenser of Comparative Example 2 was formed, the same ceramic base body as used in Comparative Example 1 was used, which was a ceramic base body the entire surfaces of which were merely polished for 45 minutes without conducting any local surface-roughening of the unit by abrasive-spraying. The conductive paste shown in Table 2 was squeegeed into a thickness of 600 μm on a table. One of the end faces of the ceramic base body was then immersed into this conductive paste to paint the conductive paste onto the one end face, and the paste was dried. Thereafter, the conductive paste was painted onto the other end face. Subsequently, the ceramic base body 1, on which the conductive paste was painted, was subjected to thermal treatment for firing to form underlying electrodes.

Furthermore, the same resin electrode paste as used in Example 1 was squeegeed into a thickness of 400 μm on a table, and then end portions of the ceramic base body were immersed thereinto to paint the resin electrode paste onto the underlying electrodes, and set the paste. In this way, overlying electrodes were formed, thus yielding each sample (stacked ceramic condenser) of Comparative Example 2 (each sample of sample No. 20 in Table 4) as illustrated in FIG. 5, which had a structure in which the overlying electrode 6a (6b) did not reach an edge portion (tip portion) of the underlying electrode 5a (5b). Other conditions were the same as used in the case of producing the stacked ceramic condensers of Example 1.

[2] Evaluation of Properties

Evaluation as to whether or not the extended-around tip portions of the external electrodes were peeled Some of the samples of each of the sample species (stacked ceramic condenser species) formed as described above were immersed in a Sn-3.0Ag-0.5Cu soldering bath (M705, manufactured by Senju Metal Industry Co., Ltd.) heated to 280° C. for 20 seconds.

After the immersion was ended, each of the samples was fixed with a resin to perform a DPA (destructive physical analysis) thereof. Specifically, the sample was observed through a stereoscopic microscope of 200 magnifications to examine whether or not the overlying electrode 6a or 6b was peeled at the tip portions of the regions extended around the side faces 14a, 14b, 14c and 14d, over the corner lines, from the end face 4a or 4b of the ceramic base body 1.

(2) Pickup Test

About some of the samples of each of the formed sample species, a pickup test was made by air adsorption using an automatic mounting machine. The number of samples which failed to be held (samples which dropped out), out of the entire samples, was counted, and the dropping failure percentage was calculated (n=200).

(3) Substrate Bending Test (Flexure Limit Test)

About some of the samples of each of the formed sample species, a flexure limit test (volume method) was made according to a printed board bending resistance test (JIS C5101-1, item 4.35).

Specifically, a solder Sn-3.0Ag-0.5Cu was used to mount each of the samples (stacked ceramic condensers) onto a cupper land, 40 mm×100 mm×1.6 mm (thickness) in size, on a glass epoxy-resin substrate (property F) under a condition that the reflow top temperature was 270° C. The substrates on which the respective samples were mounted were bent under a condition that the substrate bending speed was 1 mm/s. When the substrates were bent by a distance of 8 mm, the generation proportion of detectives was examined (n=20). About this detective generation proportion, samples about which the volume change ratio reached ±10%, out of the entire samples, in this test were judged to be as defectives. The proportion (%) of the number of the defectives to the number of the samples was calculated out. The obtained value was defined as the detective generation proportion.

Measurement results of the above-mentioned properties are shown in Table 4.

Table 4 shows the following together:

(a) the period when the entire surfaces of each of the ceramic base body species were polished, (b) the period when each of the unit species was locally surface-roughened by abrasive-polishing, (c) the ten-point average roughness Rz1 of the regions A of the ceramic base body species to which the tip portions of the resin electrodes 6a and 6b constituting the external electrodes 10a and 10b, respectively, were bonded, and the ten-point average roughness Rz2 of the regions B of the surface of the ceramic base body 1 species where the external electrodes were not formed.

TABLE 4

| Sample No. | Entire surface polishing period (min) | Local surface-roughening period (min) | Ten-point average roughness Rz1 (μm) | Ten-point average roughness Rz2 (μm) | Peel generation percentage of tip portions of extended-around regions (%) | Dropping failure percentage (%) | Substrate bending test defective generation percentage (%) |
|---|---|---|---|---|---|---|---|
| 1* | 45 | 10 | 1.5 | 1.0 | 30 | 0 | 0 |
| 2* | 45 | 20 | 2.2 | 1.1 | 5 | 0 | — |
| 3 | 45 | 30 | 3.3 | 1.1 | 0 | 0 | 0 |
| 4 | 45 | 40 | 3.9 | 1.0 | 0 | 0 | 0 |
| 5 | 45 | 50 | 4.9 | 1.1 | 0 | 0 | 0 |
| 6* | 30 | 0 | 1.7 | 1.9 | 25 | 0 | 0 |
| 7* | 30 | 10 | 2.6 | 1.8 | 5 | 0 | — |
| 8* | 30 | 20 | 3.1 | 1.8 | 5 | 0 | 0 |
| 9 | 30 | 30 | 3.8 | 1.9 | 0 | 0 | 0 |
| 10 | 30 | 40 | 4.8 | 1.7 | 0 | 0 | 0 |
| 11* | 15 | 0 | 3.0 | 3.0 | 5 | 0 | 0 |

TABLE 4-continued

| Sample No. | Entire surface polishing period (min) | Local surface-roughening period (min) | Ten-point average roughness Rz1 (μm) | Ten-point average roughness Rz2 (μm) | Peel generation percentage of tip portions of extended-around regions (%) | Dropping failure percentage (%) | Substrate bending test defective generation percentage (%) |
|---|---|---|---|---|---|---|---|
| 12 | 15 | 10 | 3.7 | 3.1 | 0 | 0 | 0 |
| 13 | 15 | 20 | 4.4 | 3.2 | 0 | 0 | 0 |
| 14 | 15 | 30 | 5.1 | 3.1 | 0 | 0 | 0 |
| 15 | 15 | 40 | 5.8 | 3.0 | 0 | 0 | 0 |
| 16* | 5 | 0 | 4.2 | 4.2 | 0 | 0.5 | — |
| 17* | 5 | 10 | 5.0 | 4.1 | 0 | 0.5 | — |
| 18* | 5 | 20 | 5.9 | 4.0 | 0 | 1 | — |
| 19* (Comparative Example 1) | 45 | 0 | 1.0 | 1.0 | 75 | 0 | 0 |
| 20* (Comparative Example 2) | 45 | 0 | — | — | 0 | 0 | 50 |
| 21 (Example 1) | 15 | 10 | 3.9 | 3.2 | 0 | 0 | 0 |

As shown in Table 4, in the case of the samples (samples of sample Nos. 3 to 5, 9, 10, and 12 to 15) according to the examples of the invention, which satisfied Rz1>Rz2 and Rz1>3.3 μm, it was verified that the extended-around tip portions of the overlying electrodes from their ceramic base body were able to be restrained from being peeled. This is based on the following: the surfaces of the regions where the external electrodes were formed were roughened; thus, an anchor effect makes an improvement in the physical adhesive strength of the overlying electrodes (conductive resin) onto the ceramic base body.

In the case of the samples according to the examples of the invention, which satisfied the above-mentioned requirement, their regions where the external electrodes were not formed were high in smoothness; thus, it was not verified that the samples dropped out when picked up by air adsorption. This is based on the following: the surface smoothness of their ceramic base body was improved so that air leakage was restrained at the time of the picking-up, thus improving the ceramic base body in adsorbable force.

Furthermore, in the case of the samples according to the examples of the invention, which satisfied the above-mentioned requirement, it was not verified that a defective was generated in the substrate bending resistance limit test.

By contrast, in the case of the samples which did not satisfy the requirement of Rz1>Rz2 and Rz1>3.3 μm (the samples about each of which symbol "*" was attached to the sample No.), it was verified as shown in Table 4 that an inconvenience was generated which was either the generation of a peel of the extended-around tip portions of their external electrodes, or the drop in the pickup test.

However, about the substrate bending resistance limit test, it was not verified that in the case of the samples which did not satisfy the requirement (the samples about each of which symbol "*" was attached to the sample No.), a defective was generated.

In the case of the samples of Comparative Example 1 (the samples of sample No. 19), in each of which the entire surfaces of the ceramic base body were merely polished and no local surface-roughening was performed, it was verified that the extended-around tip portions of their external electrodes were peeled in a particularly high proportion of 75%. This is based on a matter that no anchor effect was gained since no local surface-roughening was performed.

In the case of the samples of Comparative Example 2 (the samples of sample No. 20), which had a structure in which their overlying electrodes, which were the resin electrodes, were formed in the rear of the tip portions of their underlying electrodes, and the extended-around tip portions of the overlying electrodes were not bonded to their ceramic base body, it was verified that the defective generation percentage was as high as 50% in the substrate bending resistance test. It is presumed that this was based on a matter that stress was concentrated into the underlying electrodes, which were high in elasticity, since the overlying electrodes did not completely cover the upper areas of the underlying electrodes.

Example 2

Figure 6:
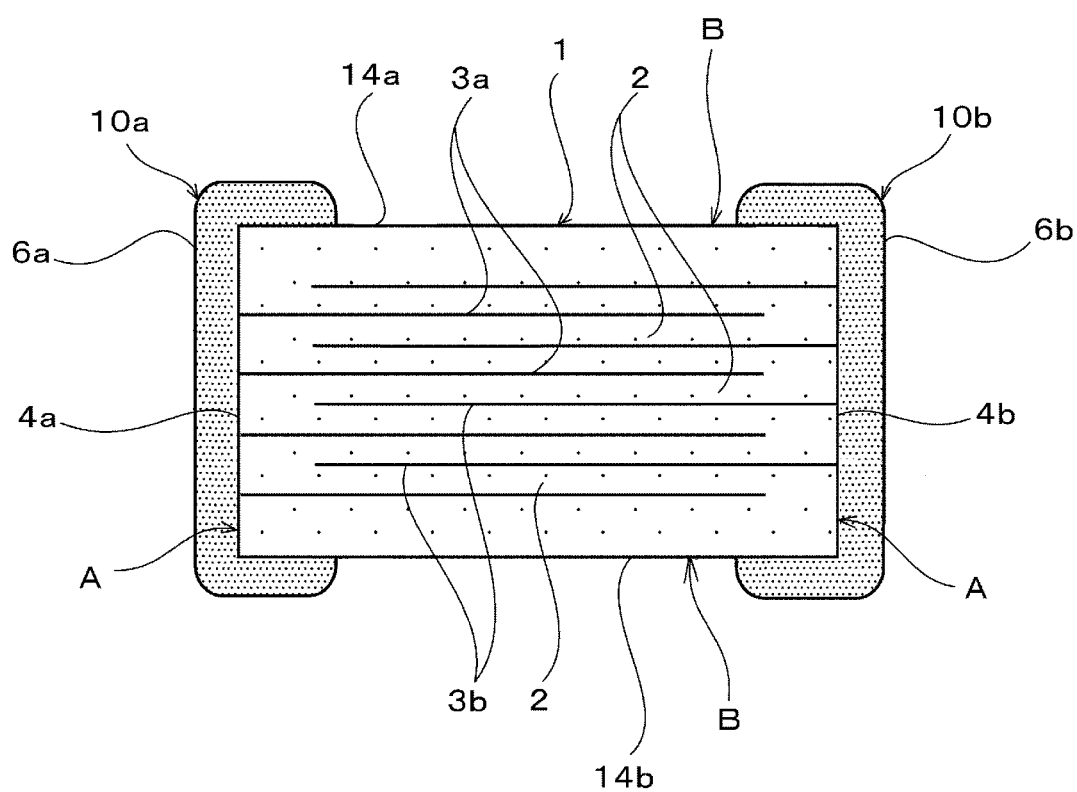
FIG. 6 is a front sectional view of any one of chip-type ceramic electronic components according to another example (Example 2) of the invention.

FIG. 6 is a perspective view illustrating any one of chip-type ceramic electronic components (stacked ceramic condensers) according to another example (Example 2) of the invention. In this stacked ceramic condenser, external electrodes 10a and 10b do not have any underlying electrode as in Example 1, and are each made into a mono-layered structure made only of a resin electrode 6a or 6b. However, the chip-type ceramic electronic component of this example has first and second plating film layers in the same manner as in Example 1.

The chip-type ceramic electronic component was formed by the following method:

First, each of the same ceramic base bodies as in Example 1 was prepared, and the entire surfaces of the ceramic base body were polished, and then the body was locally surface-roughened under conditions of:

(1) the period when the body was barrel-polished using an alumina slurry was 15 minutes, and (2) the period when the local surface-roughening was performed by spraying broken alumina powder was 15 minutes.

Subsequently, differently from the case of Example 1, only resin electrodes, which were formed as the overlying electrodes in Example 1, were formed by substantially the same method as in Example 1 without forming any underlying electrode (underlying conductor). Thereafter, by the same method as in Example 1, a first plating film layer (Ni plating film) and a second plating film layer (Sn plating film) were formed on the respective surfaces of the resin electrodes to form each sample (stacked ceramic condenser) of Example 2 (each sample of sample No. 21 in Table 4). Other conditions were wholly made equivalent to those in Example 1.

About the thus formed samples, in which no underlying electrode (no underlying conductor) was formed, the following tests were made in the same manner as in Example 1: (1) a test for examining whether or not the extended-around tip portions of the external electrodes were peeled; (2) a pickup test; (3) a substrate bending resistance test. Thus, properties thereof were evaluated. The results are together shown in Table 4.

As shown in Table 4, also when no underlying electrode (underlying conductor) is formed as in the samples (stacked ceramic condensers) of Example 2 (the samples of sample No. 21), inconveniences are not recognized, examples thereof including a peel of the extended-around tip portions of the external electrodes, the drop of the samples in the pickup test, and the generation of a defective in the substrate bending resistance test. Thus, it was verified that such a case can give stacked ceramic condensers good in properties and high in reliability.

Example 3

Figure 7:
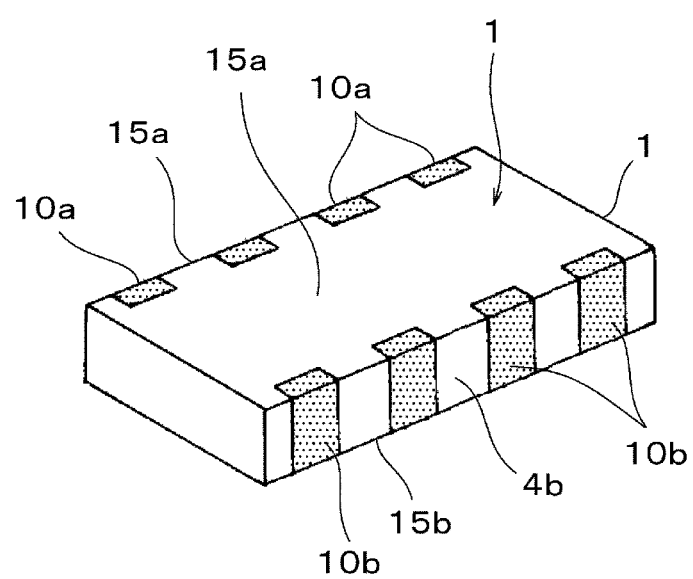
FIG. 7 is a front sectional view of any one of chip-type ceramic electronic components according to still another example (Example 3) of the invention.

FIG. 7 is a perspective view illustrating any one of chip-type ceramic electronic components according to another example (Example 3) of the invention.

This chip-type ceramic electronic component is a condenser array in which four condenser units are built in a ceramic base body 1. Four external electrodes 10a are arranged on one out of two end faces of the ceramic base body; and four external electrodes 10b, on the other end faces thereof. Each of the external electrodes 10a is extended from the end face 4a over edge lines (of the body) around an upper face 15a and a lower face 15b thereof; and each of the external electrodes 10b, from the end face 4b over edge lines (of the body) around the upper face 15a and the lower face 15b.

In the same manner as in Example 1, in the chip-type ceramic electronic component of Example 3, the external electrodes 10a and 10b are each made into a structure having an underlying electrode, an overlying electrode (resin electrode), and first and second plating film layers although this situation is not particularly illustrated.

Also in the case of a structure in which the external electrodes 10a and 10b are arranged to be extended from the end faces 4a and 4b, respectively, around the upper face 15a and the lower face 15b as in each of the array-type chip-type ceramic electronic components in Example 3, a chip-type ceramic electronic component high in reliability is obtained which can restrain a peel of the extended-around tip portions of the external electrodes, the drop in the pickup test, and the generation of a defective in the substrate bending resistance test and other inconveniences by causing the ceramic electronic component to satisfy the following requirement: Rz1>Rz2, Rz1>3.3 μm, and Rz2<3.2 μm wherein Rz1 is the ten-point average roughness of surface regions of the ceramic base body to which the overlying electrodes are bonded in the extended-around tip portions of the external electrodes, and Rz2 is the ten-point average roughness of the regions of the surface of the ceramic base body where the external electrodes are not formed. This matter is verified.

The above-mentioned examples have each been described, giving an example in which the underlying electrodes, which function as undercoats of the resin electrodes, are baked electrodes formed by painting and baking a conductive paste. However, the underlying electrodes may each be a plating electrode formed by plating the end face to which one of the internal electrodes is exposed, and growing a plating metal precipitated onto the exposed portion of the internal electrode.

The above-mentioned examples have each been described, giving an example in which the chip-type ceramic electronic component is a stacked ceramic condenser. However, the invention may also be applied to various chip-type ceramic electronic components, such as a chip-type ceramic coil component, and a chip-type LC composite component.

The invention is not limited to the above-mentioned examples in any other point. In the scope of the invention, various applications or modifications may be added to: the constituent material of an internal electrode; a specific shape and the constituent material of a ceramic base body; kinds of a conductive power, a resin, a solvent and others used for a resin electrode paste (conductive resin composition) for forming an overlying electrode; and others.

DESCRIPTION OF REFERENCE SYMBOLS

1 Ceramic stacked body (ceramic base body)
2 Ceramic layers
3a, 3b Internal electrodes
4a, 4b Ceramic base body end faces
5a, 5b Underlying electrode (baked electrodes)
6a, 6b Overlying electrodes (resin electrodes)
10a, 10b External electrodes
11 Holding plate
12 Holding holes
13 Nozzles
14 Spray machine
14a, 4b, 14c, 14d Ceramic base body side faces
15a Ceramic base body upper face
15b Ceramic base body lower face
A Regions of the ceramic base body surface where the external electrodes are arranged
B Regions of the ceramic base body surface where the external electrodes are not formed

The invention claimed is:

1. A chip-type ceramic electronic component comprising:
a ceramic base body having a first end face and a second end face opposed to the first end face, and a plurality of side faces connecting the first end face and the second end face to each other;
an external electrode extending from one of the first end face and the second end face onto at least one side face of the plurality of side faces and not onto the other of the first end face and the second end face, the external electrode including a tip portion extending onto the at least one side face of the plurality of side faces, wherein the tip portion is constituted by a resin electrode comprising a resin and a conductive component;
wherein a relationship between Rz1 and Rz2 satisfies the following requirement:

Rz1>Rz2,

Rz1>3.3 μm, and

Rz2<3.2 μm, and wherein Rz1 is a ten-point average surface roughness of a first region of a surface of the ceramic base body to which the tip portion of the external electrode is bonded, and Rz2 is a ten-point average surface roughness of a second region of the surface of the ceramic base body where the external electrode is not located.

2. The chip-type ceramic electronic component according to claim 1, wherein the ceramic base body is a rectangular-parallelepiped-shaped body, the plurality of side faces are four side faces, and the external electrode extends onto the four side faces.

3. The chip-type ceramic electronic component according to claim 1,
wherein the ceramic base body includes an internal electrode, and the internal electrode is led out to the one of the first end face and the second end face.

4. The chip-type ceramic electronic component according to claim 1,
wherein the external electrode comprises:
an underlying electrode bonded to the surface of the ceramic base body; and
an overlying electrode arranged to cover the underlying electrode, the overlying electrode including the tip portion, and
the overlying electrode is the resin electrode.

5. The chip-type ceramic electronic component according to claim 4, wherein the overlying electrode entirely covers the underlying electrode.

6. The chip-type ceramic electronic component according to claim 5, wherein an entire circumference of the overlying electrode is bonded directly to the surface of the ceramic base body.

7. The chip-type ceramic electronic component according to claim 4, wherein the underlying electrode is one of (1) a baked electrode that was formed by firing a conductive paste comprising a metal powder, a glass powder, an organic binder and an organic solvent, and (2) a plating electrode formed by plating.

8. The chip-type ceramic electronic component according to claim 1, further comprising a plating film layer on the external electrode, the plating film layer comprising a first plating film layer made of a Ni plating film, and a second plating film layer made of a Sn plating film over the first plating film layer.

9. The chip-type ceramic electronic component according to claim 1, further comprising a plating film layer on the external electrode, the plating film layer comprising a first plating film layer made of a Ni plating film, and a second plating film layer made of a Pb plating film over the first plating film layer.

10. The chip-type ceramic electronic component according to claim 1, wherein the external electrode is a first external electrode that extends from the first end face onto at least the one side face of the plurality of side faces and not onto the second end face, the tip portion is a first tip portion, the chip-type ceramic electronic component further comprising:
a second external electrode extending from the second end face onto at least one side face of the plurality of side faces and not onto the first end face, the second external electrode including a second tip portion extending onto the at least one side face of the plurality of side faces, wherein the second tip portion is constituted by a second resin electrode comprising the resin and the conductive component.

11. A method for producing the chip-type ceramic electronic component, the method comprising:
forming a ceramic base body;
stirring the ceramic base body together with a slurry comprising an adhesive medium to polish an entire surface of the ceramic base body; and
masking a first region of the polished surface of the ceramic base body; and
spraying an adhesive to an exposed region of the ceramic base body to surface-roughen a second region of the ceramic base body where an external electrode is to be formed,
wherein a relationship between Rz1 and Rz2 satisfies the following requirement:

$Rz1>Rz2$, $Rz1>3.3$ μm, and $Rz2<3.2$ μm, wherein Rz1 is a ten-point average surface roughness of the second region to which a tip portion of the external electrode is bonded, and Rz2 is a ten-point average surface roughness of the first region of the surface of the ceramic base body where the external electrode is not formed.

12. A method for producing the chip-type ceramic electronic component according to claim 11, further comprising forming the external electrode on the ceramic base body.

13. The method for producing the chip-type ceramic electronic component according to claim 12, wherein the external electrode is formed by:
forming an underlying electrode on the surface of the ceramic base body; and
forming an overlying electrode so as to cover the underlying electrode.

14. The method for producing the chip-type ceramic electronic component according to claim 13, wherein the overlying electrode entirely covers the underlying electrode.

15. The method for producing the chip-type ceramic electronic component according to claim 14, wherein an entire circumference of the overlying electrode is bonded directly to the surface of the ceramic base body.

16. The method for producing the chip-type ceramic electronic component according to claim 13, wherein the underlying electrode is formed by one of (1) firing a conductive paste comprising a metal powder, a glass powder, an organic binder and an organic solvent to form a baked electrode, and (2) a plating process to form a plating electrode.

17. The method for producing the chip-type ceramic electronic component according to claim 12, further comprising forming a plating film layer on the external electrode, the plating film layer comprising a first plating film layer made of a Ni plating film, and a second plating film layer made of a Sn plating film formed over the first plating film layer.

18. The method for producing the chip-type ceramic electronic component according to claim 12, further comprising forming a plating film layer on the external electrode, the plating film layer comprising a first plating film layer made of a Ni plating film, and a second plating film layer made of a Pb plating film formed over the first plating film layer.

* * * * *